United States Patent [19]
Barrett et al.

[11] Patent Number: 5,338,924
[45] Date of Patent: Aug. 16, 1994

[54] APPARATUS AND METHOD FOR AUTOMATIC FOCUSING OF LIGHT USING A FRINGE PLATE

[75] Inventors: William A. Barrett; Amit Puri, both of San Jose, Calif.

[73] Assignee: Lasa Industries, Inc., San Jose, Calif.

[21] Appl. No.: 927,959

[22] Filed: Aug. 11, 1992

[51] Int. Cl.⁵ .............................................. G01J 1/20
[52] U.S. Cl. ................................ 250/201.4; 356/353
[58] Field of Search ............... 250/201.4, 201.3, 201.2, 250/201.9, 550, 234–235, 561; 356/353, 358; 219/121.61, 121.62, 121.78–121.82

[56] References Cited

U.S. PATENT DOCUMENTS

| | | |
|---|---|---|
| Re. 33,081 | 10/1989 | Murakami et al. . |
| Re. 33,185 | 3/1989 | Matsuda et al. . |
| 3,604,808 | 9/1971 | Watkins . |
| 3,617,130 | 11/1971 | Kelley et al. ............... 356/353 |
| 3,630,596 | 12/1971 | Watkins . |
| 3,932,733 | 1/1976 | Olsen et al. . |
| 4,140,362 | 2/1979 | Tien . |
| 4,169,980 | 10/1979 | Zanoni ............... 250/550 |
| 4,242,152 | 12/1980 | Stone . |
| 4,358,659 | 11/1982 | Spohnheimer . |
| 4,621,353 | 11/1986 | Hazel et al. . |
| 4,670,646 | 6/1987 | Spivey . |
| 4,686,662 | 8/1987 | Baer . |
| 4,687,282 | 8/1987 | Ferrante . |
| 4,743,117 | 5/1988 | Kitabayashi et al. ............... 356/353 |
| 4,786,084 | 11/1988 | Karney et al. . |
| 4,841,509 | 6/1989 | Kamisada et al. . |
| 4,945,220 | 7/1990 | Mallory et al. ............... 250/201.3 |
| 4,968,144 | 11/1990 | Thomas et al. . |
| 5,047,796 | 9/1991 | Tagami et al. . |
| 5,092,670 | 3/1992 | Preston . |
| 5,101,278 | 3/1992 | Itsumi et al. . |
| 5,133,601 | 7/1992 | Cohen et al. ............... 250/561 |

FOREIGN PATENT DOCUMENTS 0211306 10/1985 Japan ............... 356/353

*Primary Examiner*—David C. Nelms
*Attorney, Agent, or Firm*—Cushman, Darby & Cushman

[57] ABSTRACT

The present invention provides an apparatus and method to automatically focus an incident beam of monochromatic parallel planar light on a work piece, using a fringe plate and a vision detector. The work piece may have a perfect mirror surface, or have a non-reflective patterned surface. The incident light beam is focused on the work piece and then reflected through a fringe plate forming an interference pattern on the vision detector. The incident light beam is then scanned or wobbled. The wobbling incident light beam forms a distinctively oscillating output signal from the vision detector when the light is focused on the work piece. When the light is not focused on the work piece a distinctive and more constant output signal is produced by the vision detector. For a given position of the work piece, by noting whether the output signal is rapidly changing or relatively constant, the invention can automatically determine whether or not the work piece is at the focal point of the incident light beam. This can be used to automatically focus the etching or writing laser on the chip or wafer in a laser etching system. The present invention can also be used to automatically determine the focal surface of an objective lens.

20 Claims, 8 Drawing Sheets

2(a)　　　　　　2(b)　　　　　　2(c)

2(d)　　　　　　2(e)

APPARATUS AND METHOD FOR AUTOMATIC FOCUSING OF LIGHT USING A FRINGE PLATE

BACKGROUND OF THE INVENTION

The general field of this invention is the focusing of light. More specifically, this invention involves locating the focal point of planar parallel light passing through a converging lens, whether from a laser or a classic source, in an automatic way.

More specifically, this invention involves focusing a laser beam in an automated process or device for the manufacture of integrated circuit chips and wafers. This can be used for various purposes including exact positioning and leveling of the surface of the IC work piece, and focusing the writing laser on the Integrated Circuit work piece to write or etch Integrated Circuit patterns on the work piece.

Various methods have been developed in the prior art for automatic distance measurement and for automatic focusing of cameras and laser beams. However, the present invention represents a major innovation that is not anticipated in the prior art.

A particular advantage of the present invention is that it works equally well on a work piece that has a non-reflective pattern on it, and on a work piece that has a completely reflective mirror surface prior to processing. Previous systems for focusing lasers to etch patterns on Integrated Circuit chips have found it difficult to use optical techniques to determine the distance to, and to focus light on, a mirror surface. This invention is an advance since traditional optical distance measurement and focusing systems find it impossible to measure to and focus on a mirror reflective surface. Instead, prior art responds only to the virtual image reflected in the mirror surface. This invention is of great utility since integrated circuit chips and wafers are manufactured from a perfect mirror surface, prior to their etching to establish the circuit pattern on them.

Furthermore, this invention allows for optical focusing, distance measurement and laser etching, with the same laser and the same optical system applied to all three functions. Previous machinery that used other optical techniques for distance measurement and laser focusing, and used lasers for etching integrated circuit chips, required two different lasers for the functions (that is, a laser for the functions of distance measurement and focusing, and a laser for the function of laser etching). This raised factors of additional cost and calibration problems between the measurement/focusing lasers and the etching lasers. This is overcome with the present invention that can both focus and etch with one laser and optical system.

SUMMARY OF THE INVENTION

The preferred embodiment of the invention projects a laser beam through an objective lens to focus on a work surface. The beam is then reflected off the work surface back through the objective lens through a fringe plate. The fringe plate splits the beam into parallel beams that are then projected onto a vision detector. The split beams on the vision detector form an interference pattern. The pattern is of one type when the beam is focused on the work piece and the pattern is of another type when it is not so focused. The laser beam then is scanned or wobbled, which causes the interference pattern in the vision detector to oscillate. The vision detector can then detect the difference between the oscillating focused interference pattern and the oscillating non-focused interference pattern. In this way, as the work piece is moved in and out in relation to the objective lens, with the scanning laser beam wobbling or scanning over the work piece at each incremental distance, the vision detector can detect when the work surface is at the focal point of the laser. This is an apparatus and process that may be automated. The exact positioning of the work piece in focus can probably be determined using optimized equipment and conditions to an accuracy of one hundredth of a micron. Under less than ideal, routine conditions, and using acousto-optic deflectors, the focus position can be obtained to an accuracy of a few tenths of a micron.

In the present invention, when the exact focus position is obtained, the power of the scanning laser can be increased to be used to write or etch an integrated circuit pattern on the work piece through the same optical system. This laser beam can be focused to a point with a width of about 1.5 microns. This narrowness of the actual focused point of light is limited by the wavelength of the light used. This fine focus of the laser permits very accurate laser etching of integrated circuit devices.

BRIEF DESCRIPTION OF THE DRAWINGS

FIG. 2C shows one pattern type when the laser is focused.

FIGS. 2A, 2B, 2D, and 2E show various pattern types when the laser is not focused.

DESCRIPTION OF THE PREFERRED EMBODIMENTS

Figure 1:
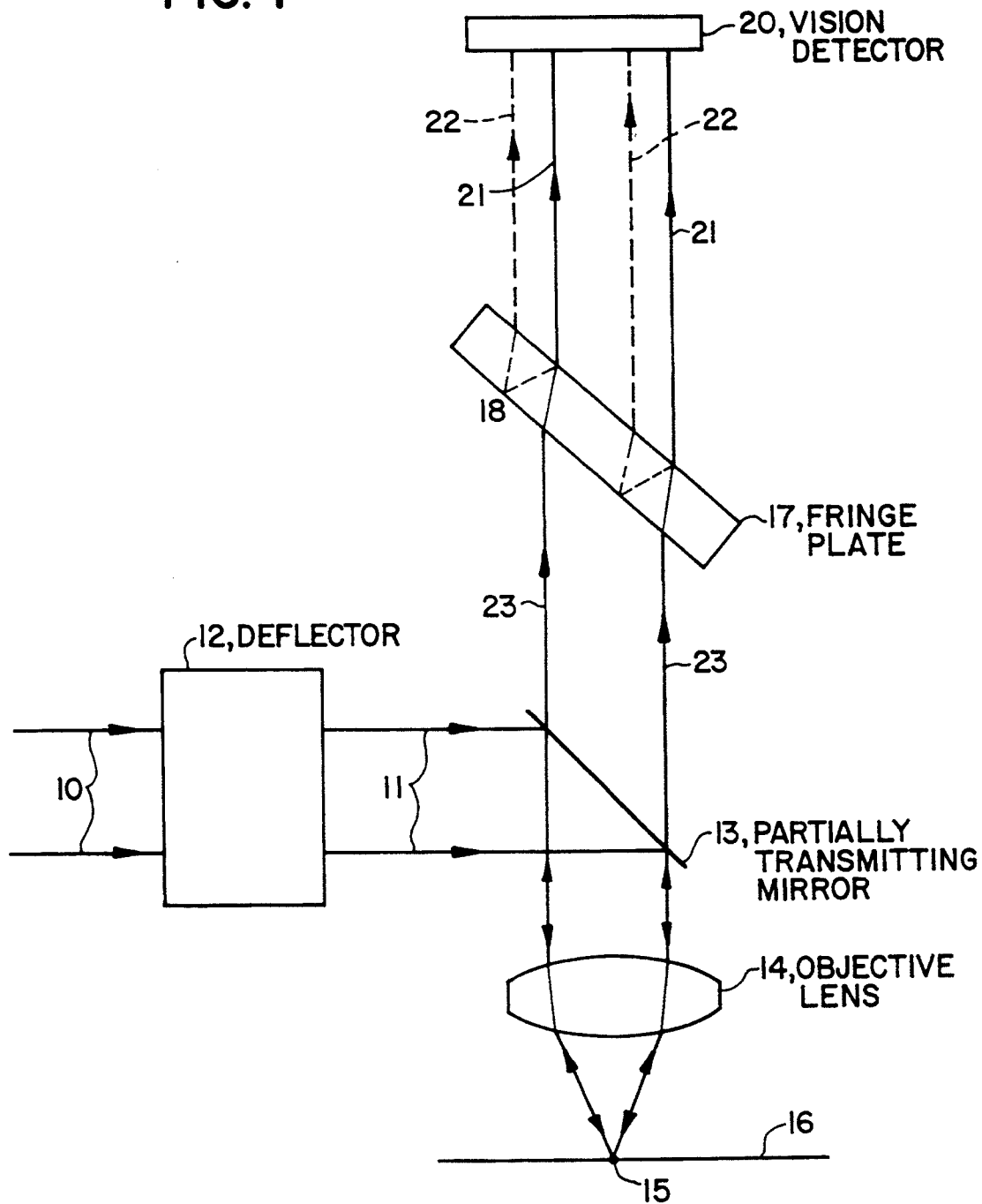
FIG. 1 shows a schematic drawing of the physical configuration of the apparatus of the invention.

FIG. 1 shows a schematic representation of the basic physical configuration of the preferred embodiment of the apparatus of the invention. The incident light beam 10 is deflected by the deflector 12 The deflected light beam is then reflected by the mirror 13. The reflected light beam 11 then passes through the objective lens 14.

The objective lens 14 focuses the incident light beam 11 to a focal point 15. The focal point 15 may be in front of, on or behind the work surface 16, depending on the distance of the work surface from the objective lens 14. The incident light beam 11 is then reflected off the work surface 16, and passes back through the objective lens 14 and partially through the mirror 13 as beam 23, and then reaches the fringe plate 17. The light beam 23 passes through the first surface 18 of the fringe plate and then is partially reflected by the interior of the second surface 19, and partially passes through 19. The reflected split beam within the fringe plate 17 passes back to the first surface of the fringe plate 18 and is reflected off the inner side of that surface 18. This beam then passes back to the second surface 19 and partially through the second surface 19. This creates a split parallel beam 22 that then passes to the vision detector 20. The split beam 22 forms an interference pattern with the primary beam 21 on the vision detector.

The light causes the vision detector to produce a signal that is proportional to the average light intensity over the entire surface of the vision detector 20. An all-light pattern produces the maximum signal. An all-dark pattern produces the minimum signal. Any pattern half of light rings and half of dark rings produces a signal at about the average between the maximum and the minimum.

In the preferred embodiment, the vision detector is a photocell that produces an output signal that is proportional to the total light energy received across the surface of the photocell in an incremental time period. Hence, if at a given instant a pattern of light of irregular intensity across the photocell is received by the photocell, then the output signal of the photocell will be proportional to the average light intensity being received on the photocell at that time.

The fringe plate has low reflectivity on each surface, but enough reflectivity that the primary beam entering the fringe plate partially interferes with a beam produced by the secondary reflection in the fringe plate. The reflectivity is low enough for the secondary beam to be less than 10% of the amplitude of the primary beam. Therefore, split beams after the secondary beam may be ignored. Higher reflectivity would improve the theoretical quality of focusing by making the fringes more distinct (by creating multiple interferences), and by making the peak of the focal curve narrower. However, in practice, the reflectivity of the fringe plate should be kept low so that more light is allowed to pass through the fringe plate to the vision detector. Furthermore, if the peak of the focal curve becomes too narrow, it may become lost between the sample points on the empirical focal point data.

Figure 2:
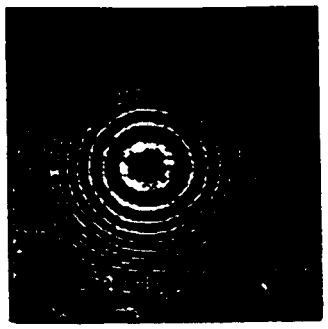
FIG. 2 shows representations of different types of the interference patterns on the vision detector.
Figure 2:
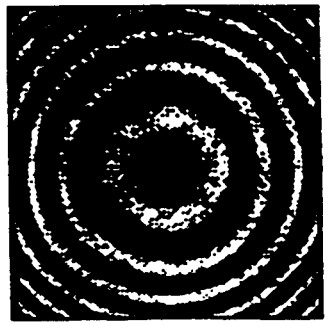
Figure 2:
Figure 2:
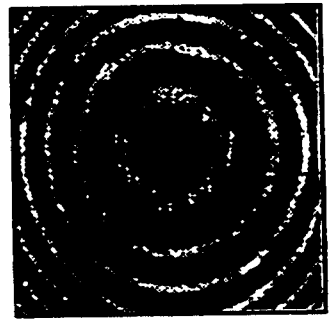
Figure 2:
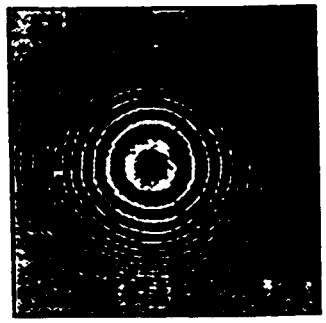

FIG. 2 shows schematic drawings of different types of interference patterns that are obtained on the vision detector. When the light is in focus, the pattern on the vision detector is either all light or all dark, as shown in FIG. 2C. If the light is not in focus on the work surface 16, because the focal point 15 is either in front of or behind the work surface, then an interference pattern of concentric light and dark rings is shown, in the manner of FIGS. 2A, 2B, 2D and 2E.

When the incident light beam 11 is wobbled or scanned so that its angle of incidence to the objective lens varies slightly around the optical axis of the objective lens, then the result is that the interference pattern image formed on the vision detector oscillates. When the work surface 16 is at the focal point, and the incident light 11 is focused on the work surface, scanning the incident light beam 11 results in the focused interference pattern oscillating from all light to all dark. Consequently, the signal generated by the vision detector oscillates from its maximum point to its minimum point.

When the incident light beam does not focus on the work surface 16 and the incident light beam 11 is oscillated, then the concentric ring interference pattern on the vision detector oscillates by the rings expanding and contracting as seen in comparing FIG. 2A with 2B or FIG. 2D with 2E. However, when the ring interference pattern oscillates, the vision detector experiences throughout the oscillation a condition where approximately half of its surface is light and half of its surface is dark. The operation of the vision detector produces a signal that is proportional to the average light intensity over the vision detector. Therefore, as the unfocused pattern of the wobbling beam oscillates, the output of the vision detector stays approximately constant around the average between the minimum and maximum output, and does not approach near the minimum or maximum output. In this manner, the apparatus can, for a particular location of the work piece, determine if the light is focused on it or not by observing the output of the vision detector while the beam is oscillated. If the output of the vision detector changes greatly from instant to instant, then the beam is focused on the work piece. And, if the output of the vision detector is more or less constant from instant to instant, then the beam is not focused on the work piece.

It is important in this regard to note that this same invention will work well whether the work piece is unworked and in a completely mirrored surface condition, or if the work piece has been partially worked and contains an integrated circuit pattern on it which may be partly reflective and partly not reflective. This is because in the pattern condition, if the work piece is focused the oscillating point of light on the work piece will either oscillate within a completely mirrored surface (in which case the method will work as described above), or the light will oscillate from the mirrored surface across a patterned non-reflective surface. In this latter case when the light spot moves from the mirrored surface to the patterned surface, the light is scattered and a complex and totally different pattern is formed on the vision detector. However, this will again result in large sudden changes in the net output of the vision detector as the focused beam is wobbled across the work surface (scanning both mirrored areas and patterned areas). This will yield the same result of indicating a focus condition as described above. In the same mode, when the light beam is oscillating in an unfocused condition on a patterned work piece, when the unfocused light is reflecting from a mirrored point, it will result in a concentric ring sort of pattern with an average vision detector signal output, and when the unfocused light moves to a patterned area, it will likewise form a pattern which will also result in a net signal somewhere between the minimum and maximum of the vision detector (but from a complex and totally different pattern), and again will result in a net signal that does not vary as radically as in the focused condition. Therefore, this basic invention will work to identify a focus position regardless to whether the work piece is patterned or mirrored. That is, the maximum point in the focus curve as shown in FIGS. 3, 4 and 5, will appear when the work piece is at the focal distance from the objective lens on the optic axis, as the light is scanned or wobbled, regardless of the surface of the work piece.

Figure 3:
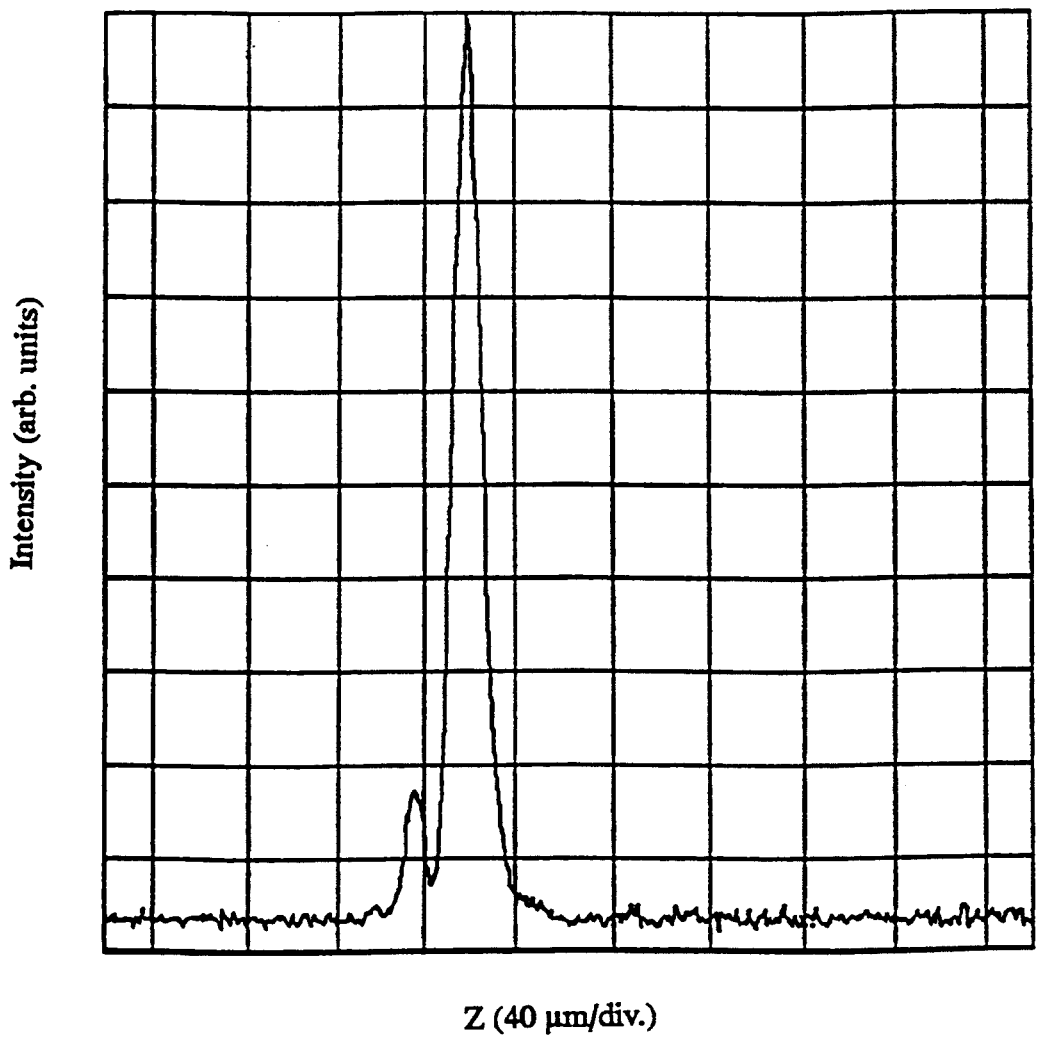
FIG. 3 shows a focus curve. Z, the horizontal axis, is the distance of the work surface from the objective lens. Y, the vertical axis, is a measure of the average rate of change in the signal from the vision detector as the light beam is wobbled or scanned.

FIG. 3 shows an empirical focus curve. The horizontal axis shows the distance Z from the work piece to the objective lens. The vertical axis shows a function of the rate of change of the output of the vision detector as the angle of the incident light beam is wobbled. The mathematics of this function is described below in more depth.

Figure 4:
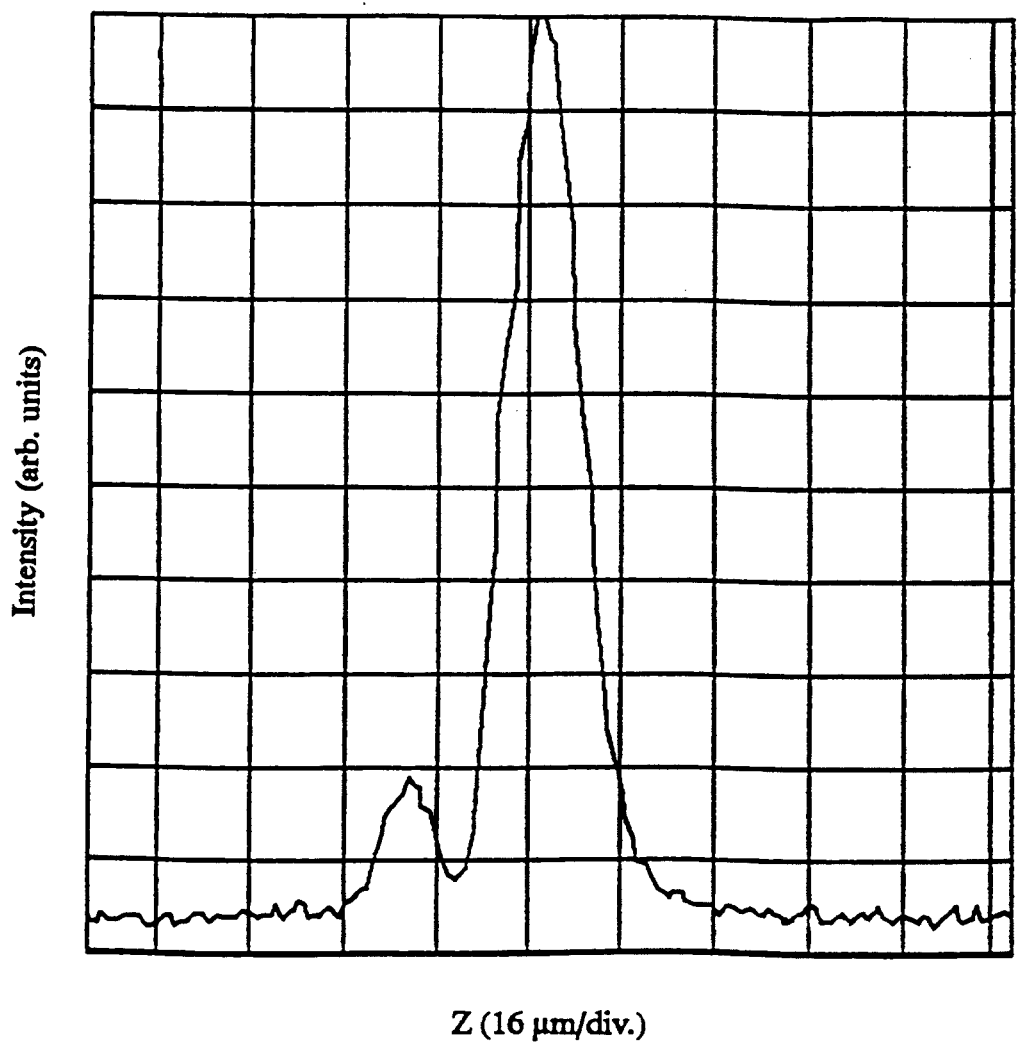
FIG. 4 is a second focus curve taken over a narrower Z range.

FIG. 4 is the same graph as in FIG. 3, except the horizontal axis is presented at a different scale to exaggerate the width of the focus curve.

Figure 5:
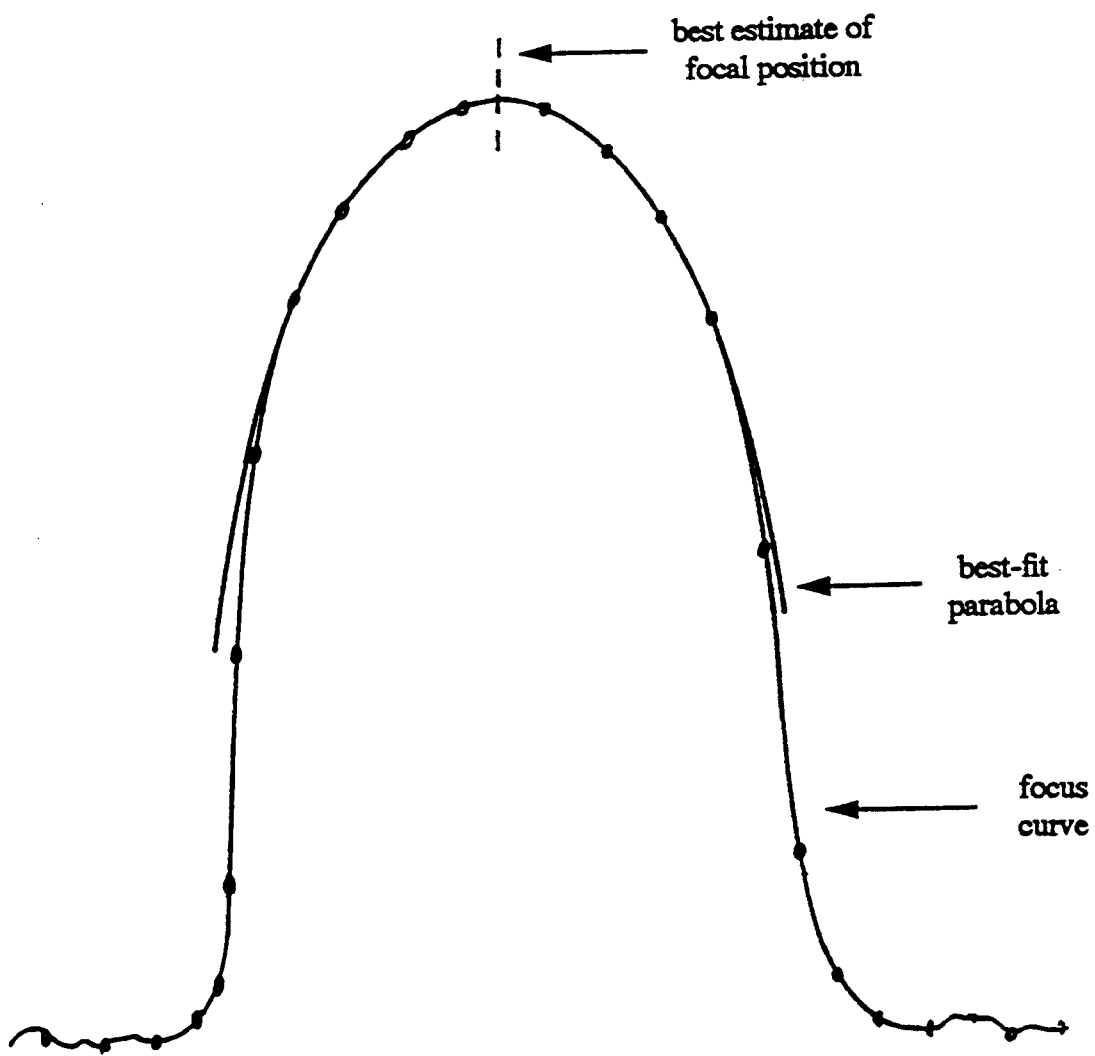
FIG. 5, in schematic form, shows the estimation of a best fit parabola to find the best estimate of focus position using the least squares method to apply to the empirical focus curve data.

FIG. 5 shows the application of least-squares multiple regression to fit a parabola to the empirical focus curve, to filter out noise to find the focus point more accurately.

Figure 6:
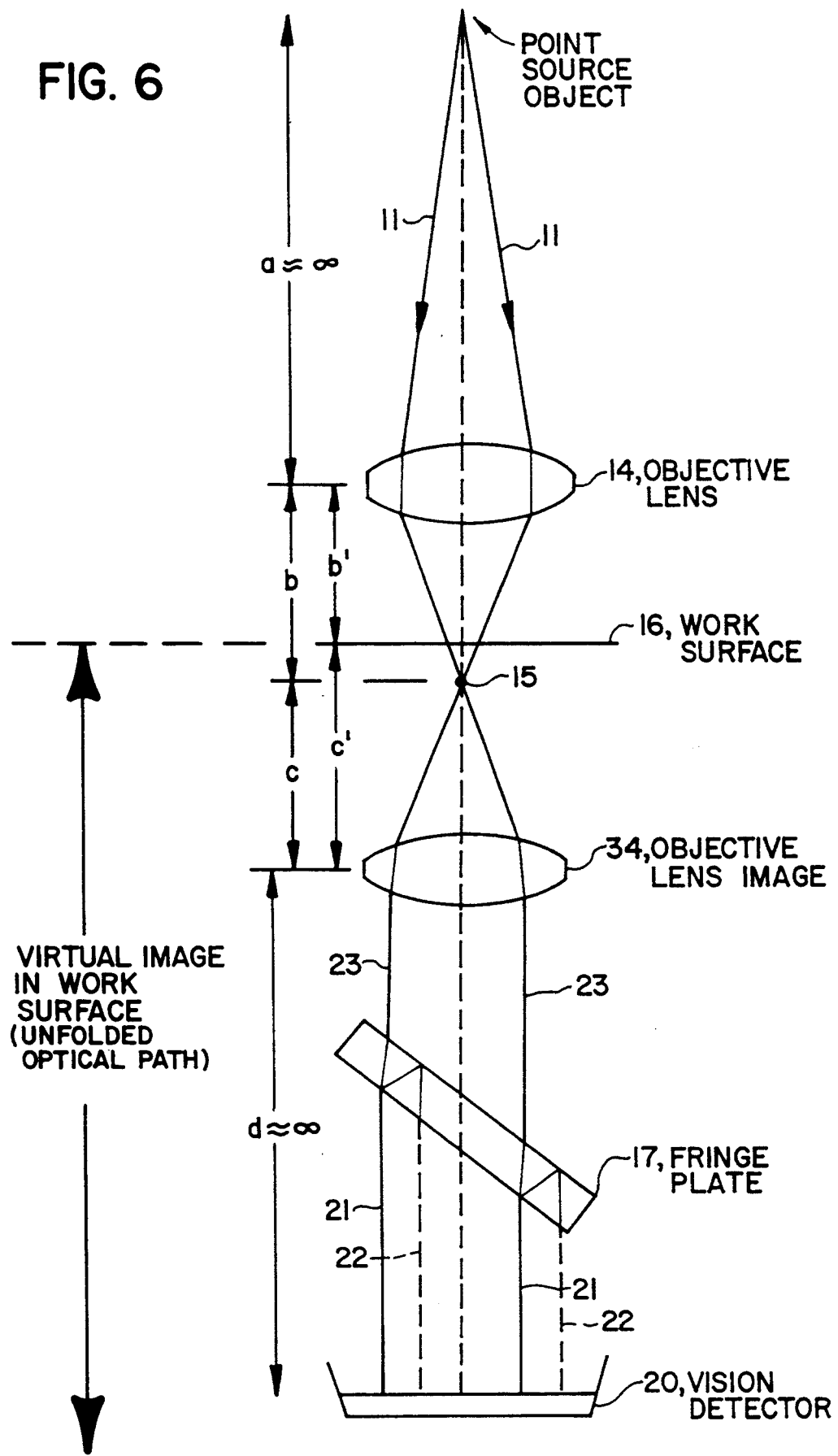
FIG. 6 shows in schematic form the virtual image in the mirrorlike work surface in the present invention.

FIG. 6 shows the virtual image theoretical system corresponding to the real image system in FIG. 1.

The Optical Theory Artificial Fringes

If the fringe plate surfaces are planar and parallel and the incident beam 11 has a planar wavefront, then the interference phase surface is also planar. That is, the vision detector will see a total light intensity across its entire surface (Iv) that has the form $$Iv = I22 + I21 + 2 \times (I22 \times I21) \times \cos\delta \quad (1)$$

where $\delta$ is the phase difference between the secondary beam 22 and the primary beam 21. $\delta$ is a function of the angle between the incident wave 23 and the fringe plate surfaces 18 and 19. I221 and I22 are the intensities of beams 21 and 22 respectively.

Figure 8:
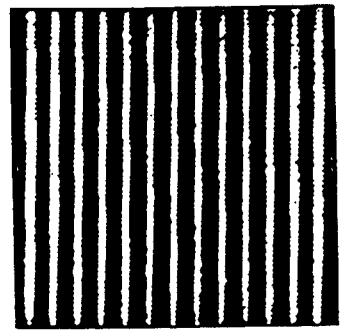
FIG. 8 shows a plot of the vision detector signal intensity as a function of the beam position in the X and Y coordinates as the beam scans the work piece. This is a computer generated image of the artificial fringes discussed herein.

The function of the deflectors is to scan the beam 11 at the across the optic axis of the system in a small range. The beam 11 will then scan a similar angle across the focal point 15. As the light beam scans, $\delta$ will change rapidly, causing Iv to vary up and down once for every $2\pi$ radians (360°) change in $\delta$. Thus the vision detector signal intensity will vary in such a manner as to appear to have fringes when plotted as a function of the (x, y) beam position (see FIG. 8). These are called "artificial fringes" since they cannot be viewed on the surface of the vision detector, but only by plotting the data from the scan in such a manner.

Note that the "artificial" fringes do not change with the lateral movement of a mirrorlike flat work surface, since moving laterally merely replaces one part of the mirror surface for an equivalent part.

Mathematics of Autofocusing

When the work surface is moved down slightly from its focused position, as shown in FIG. 1, the incident beam 11 continues to be planar and parallel, and continues to be focussed at the same position, but the mirror surface is at a slightly different position. This causes the reflected beam 11 above the objective lens 14 to be slightly converging. (When the object is farther from a convex lens than its focal point, the image is real, which means the image light rays are converging).

Converging light rays on the fringe plate create an interference pattern at the vision detector different from that in the focused condition. The wave fronts of constant phase are spherical rather than planar, and their intersection with the vision detector surface will be a set of concentric circles. If there are more than two or three circles across the vision detector's surface, then the artificial fringes will disappear since the real fringe intensity variations become averaged to zero over the surface of the vision detector. The artificial fringes will disappear entirely if there are more than a half dozen circles at the detector. This would be the case for an increasingly convergent beam 11.

A diverging beam 11 (created when the work surface is between the lens and the focal point) passing through the fringe plate 17 would show the same circular interference pattern at the vision detector, and similarly cause the artificial fringes to vanish.

The vision detector 20 is a photocell in the preferred embodiment. The photocell signal is measured as the incident beam 11 is swept through its small range of angles. The first derivative of the signal with respect to angle is taken, and the sum of its squares computed. This comprises a measure M of focus quality. M is a function of distance Z. A typical M(z) for the invention is shown in FIGS. 3 and 4, where the horizontal axis is Z and the vertical axis is M(Z).

The half-width of the focus peak in FIG. 4 is 16 microns. Some measurement noise is evident in both FIGS. 3 and 4. One noise component arises from variations in intensity of the laser beam and this can be seen in the baseline at distances far from the focus peak. Another arises from random errors in measurement of the lens position. This can be seen as the wobbles in the steep edges of the focus curves, which are too large to be explained by laser light noise. Because of this noise, the maximum point of the empirical focus curve is not a reliable indicator of the best focus position. It is better to first obtain a least-squares multiple regression fit to a symmetrical curve, such as a parabola, of the upper portion of the empirical focus curve data, as illustrated in FIG. 5. By doing this, the effects of noise are reduced and a more accurate determination of the focal point is obtained.

The Mathematics of the Focus Algorithm

The complete automatic fringe focus algorithm has several steps.

In Step 1, upper and lower limits of z (zu, zl) are independently fixed. These limits must be such that the work surface always lies within them. The work surface will vary in height from case to case owing to variations in the way in which it is mounted in its carrier and other factors.

In Step 2, the lens is moved between those limits Zu and Z1 in small steps. Two micron steps are a good compromise between precision and speed.

In Step 3, at each lens position, the focus measure M(z) is determined as explained in the preceding section. Since z varies in discrete steps, M(z) is kept in computer memory as an array of numbers.

In Step 4, the maximum point of M(z) is determined, called M(z0).

In Step 5, a requirement is placed on M(z) in order to verify that the system has found a valid focus condition. The requirement is:

$$M(z) < v\, M(z0), \text{ for all } z < (z0-dz) \text{ and for all } z > (z0+dz) \quad (2)$$

Here, v is typically 0.5. Where dz is a small deviation in z from z0. For the curve of FIG. 4, dz might be 16 microns. This condition requires that M(z) be less than 50% of its peak value for all off peak positions of Z. If the true focal position is outside the upper and lower bounds set for z, this condition will fail.

In Step 6, two points z1 and z2 are determined such that $$z1 < z0 < z2 \text{ and } M(z1) \approx M(z2) \approx v\, M(z0) \quad (3)$$

That is, z1, and z2 are about half way down the peak from the maximum.

In Step 7, (z2−z1) must exceed some set value, that is, there needs to be a minimum number of sample points in the range from Z1 to Z2. This range will span the top half of the peak.

In Step 8, a parabola is fitted to the values M(z1) . . . M(z2) using a least-squares multiple regression calculation. This evens out the noise from the empirical measurement of the peak. The axis of the parabola is taken to be the best estimate of the focus position, that is, of the true top point of the peak with the error noise smoothed away. This is shown in FIG. 5.

The First Order Theory of Error

FIG. 6 shows the virtual image theoretical system (unfolded optical path) corresponding to the real image system in FIG. 1 with a mirror surface work piece 16. Assume that the incident beam 11 is diverging with a large object distance "a". The image distance in the objective lens is "b", and these two distances are related by the thin lens equation $$1/a + 1/b = 1/f \quad (4)$$

where f is the focal length of the lens.

Now assume the work surface 16 is not at the image position (focal point 15), but slightly above it, at a distance b′ from the principal plane of the lens.

Since the work surface 16 is a mirror, in theoretical analysis it can be removed and replaced by a virtual optical system in its reflected space. There will be a virtual objective lens 34 with an object distance c, and positioned at c′ from the work surface 16. There will be an image distance d, which must be infinity for the strongest possible artificial fringes.

$$d \approx \infty \text{ implies that } c \approx f.$$

From FIG. 6, we see that $$b + c = b' + c' \quad (5)$$

Also the work surface 16 as a mirror implies that $$b' = c' \quad (6)$$

We can solve these equations for a in terms of b′ and f; the result is $$a = f(2\,b' - f)/(2\,(b' - f)) \quad (7)$$

Solving equation (7) for b′, we obtain $$b' = (af - f^2/2)/(a - f) \quad (8)$$

In a similar manner, we can find b:

$$b = af/(a - f) \quad (9)$$

The difference between b and b′ is a "focus error" $\epsilon$ caused by the nonplanarity of the incident light 11. $\epsilon$ is the difference between the true work surface 16 and the perceived surface as seen by maximum artificial fringe intensity:

$$\epsilon = f^2/(2\,(a - b)) \quad (10)$$

Since we expect that a >> b, this is very nearly $$\epsilon = f^2/(2a) \quad (11)$$

or $$a = f^2/(2\epsilon) \quad (12)$$

Note that the interference patterns can form even though the incident beam is diverging or converging. It is possible to find a position for the work surface 16 such that beam 23 is planar. The apparent focus position is not at f. Instead, it is at a small distance $\epsilon$ from f, given by equation (11). The inverse equation (12) is useful in estimating how close to planar the incident beam 11 must be in order to meet a certain focus tolerance.

For example, if a focus displacement error of 2 microns can be tolerated owing to some convergence/divergence of the light beam 11, then the object distance "a" must be at least 128 meters (assuming a focal length of 16 mm). In fact, the inventors have observed displacement errors as large as 5 microns, which means that the incident beam 11 had an object distance of 51 meters.

Equation (11) can be used to estimate how far from planar the incident beam 11 is. To do this, a workpiece 16 with a blank area near a tightly patterned area is used. (The two areas should lie in the same plane within a fraction of a micron). The workpiece is leveled. The beam 11 is focused at the blank area, then at the patterned area repeatedly several times. Then the average difference in focus position is $\epsilon$, from which the incident beam object distance "a" can be estimated. "a" is usually so large that a direct measurement is impractical.

Artificial Fringes as a Function of Incident Angle

In the preferred embodiment, in order to cover the whole deflection field, the incident beam angle varies over a range of approximately 1 degree from its centered position. Referring to FIG. 6 again, first-order lens theory predicts that the locus of the focal points 15 will be a plane orthogonal to the lens axis. This of course assumes that there is no deviation from planarity of the incident beam 11 and that the lens is optically perfect over this range of angles.

From the point of view of fringe generation, the virtual objective 34 on the other side of the work surface 16 will have a point source 15 as its object, with point source 15 off its lens axis. Again, lens theory predicts that this lens will produce planar light on its image side. This light beam 11 will bear the same angle to the optical axis as the incident beam 11 and will produce the same broad artificial fringes as one aligned along the optic axis.

As the beam angle changes, the average artificial fringe amplitude seen by the photocell varies up and down. In FIG. 1, the largest variation is for a beam angle change in the plane of the figure, that is, about an axis of rotation perpendicular to the paper. The variation about the other axis (for the beam 11, that is the horizontal axis in the plane of the paper) is much weaker, and for small angles, is almost absent.

Thus the artificial fringes will appear to be linear bands (see FIG. 8) whose orientation is determined by the angle of the fringe plate 17 with respect to the optic axis and the plane of reference in FIG. 1. In FIG. 1, call a lateral rotation of the beam 11 the "x" direction and a vertical rotation (into and out of the paper) the "y" direction; then the artificial fringes will be oriented along "x".

Using Fringes to Determine the Focal Surface of a Lens

The present invention can be used to determine the focal surface of a lens automatically. Plane parallel light passing through a converging lens will be focussed to a near-point on the image side of the lens, whether the direction of the incident light beam is along the optic axis or not. A means of moving the work surface vertically (in FIG. 1) and of measuring its position, z, is required. Fringe focusing is used to determine the optimum focus position z as a function of the (x, y) lateral position of the focussed spot relative to the lens axis. This defines a nearly planar surface, which is the image surface (or focal surface) of the lens.

For the best results, the incident light beam should be varied in angle with rotating mirrors in order not to distort its wavefront or change its planarity with angle. (Acousto-optic deflector are known to introduce some wavefront distortion as a function of angle.)

Figure 7:
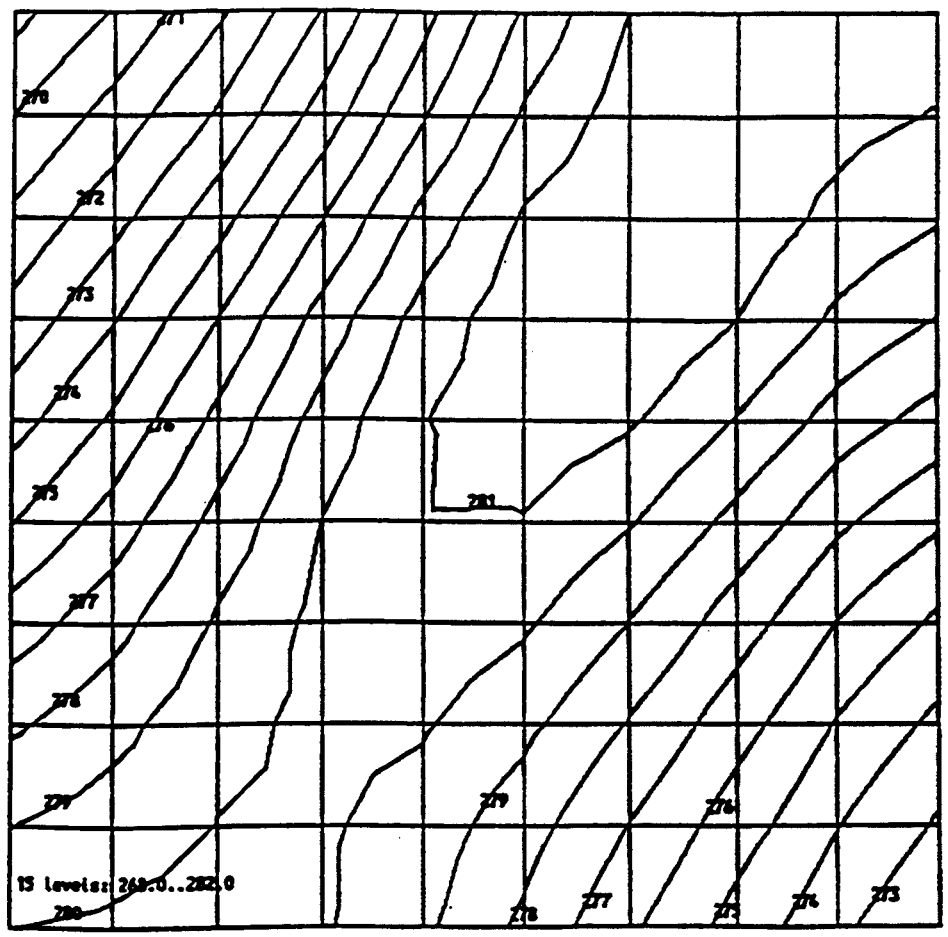
FIG. 7 is a contour map of the focal surface obtained by an automatic method of the present invention. The units of measurement are microns.

FIG. 7 is a contour map of the focal surface obtained automatically through the use of the autofocus algorithm and fringe focusing applied to a large number of positions within the lens field of view. The units are microns. The lens focal length is 16 mm.

Astigmatism in the lens can be estimated by rotating the fringe plate about the optic axis, since the focus method finds the best focus in a direction orthogonal to the fringes. In the case of FIG. 7, the orthogonal direction is about 135 degrees, that is, lower right to upper left.

Sensitivity of Fringe Focusing

In the actual embodiment, the autofocus curves have a 50% width of 16 microns. The best focus position is not just the position of the peak value, but is a "best-fit" estimate obtained by fitting a parabola to the upper portion of the peak using a least-squares regression analysis. This helps reduce noise which causes the peak to be somewhat distorted from one focus scan to the next. The noise in z in FIG. 4 is be about 1 micron. By using all the points within a halfwidth (about 8 points), that noise can be reduced to 0.35 microns. Z cannot be measured to a better precision, so this is an acceptable noise level. By reducing the random errors in z, the random noise of the laser light and photocell amplifier electronics would remain. But these factors can affect the best focus position only to the extent that the focus peak is broad rather than narrow. By reducing the focus peak width, the influence of these secondary noise sources can be reduced.

Focus Peak Width

The width of the focus peak is a function of several factors, the most important of which are: 1) the thickness and coatings of the fringe plate, 2) the distinctiveness of the artificial fringes, which depends on the quality of the lens and local planarity of the work surface, 3) the effective diameter of the stops near the vision detector, and 4) the plane parallel quality of the incident beam.

Beam quality, lens quality and work surface quality have an effect on the overall coherence of the beam near the fringe plate. The extent to which any of these depart appreciably from the ideal determines how strong the artificial fringes are.

By increasing the fringe plate thickness, the artificial fringes will become more closely spaced. However, they may also become weaker due to the quality factors. More closely spaced fringes also make the null condition (near perfect focus) more distinct. By increasing the fringe plate reflectivity, the fringes will become sharper, that is narrower. This is a result of multiple reflections in the plate. By making the fringes sharper, the second derivatives will increase and they will disappear more rapidly with z, as z departs from the focus position. At a sufficiently high reflectivity, the fringes will probably disappear altogether owing to the quality factors.

Fringe Focus Width Prediction

Two formulas are important to predict fringe focus width. The first formula estimates the artificial fringe pitch P. This is the effective wavelength of the artificial fringes as seen in the computer-generated image, e.g. FIG. 8:

$$P = \lambda f / (\alpha \beta d) \tag{13}$$

where
$\lambda$ = wavelength of the Argon laser light, 0.515 microns
f = lens focal length, 16 mm
$\alpha = = \sqrt{[\sin 2\theta / (n^2 - \sin^2 \theta)]}$
d = thickness of the fringe plate, 1.6 mm
n = index of refraction of the fringe plate, 1.472
$\theta$ = angle of fringe plate to optic axis, 45 degrees
P = apparent artificial fringe pitch, in microns
Then
$\alpha \beta = 0.774$
and
P = 6.7 microns.
The observed P is 7 microns.

The second formula predicts the half-width of the focus curve. This is:

$$\epsilon = \lambda f^2 / (5.72 \, r0 \alpha \beta d) \tag{14}$$

where $\lambda$, $f^2$, $\alpha$, $\beta$ and d are defined above. r0 is the effective radius of the photocell area receiving reflected light through the fringe plate. r0 should be about 5000 microns. The number 5.72 is a result of an integration of linear fringes, over a circular area. This integral does not have a closed form, but it predicts how the photocell signal falls off as the fringe spacing at the photocell surface decreases. With the values indicated above,
$\epsilon = 3.7$ microns.

The observed half-width is 8 microns. The factor of two disagreement between the theoretical and observed values may be the results of empirical error.

In conclusion, note that the quality of fringe focusing depends on:
1. The planarity of the incident light.
2. The local planarity of the work surface.
3. The quality of the optics of the system.
4. The thickness of the fringe plate. The thicker the plate, the narrower the focus curve.
5. The reflectivity of the fringe plate surfaces. By increasing the reflectivity, the fringes will become sharper, which improves focus quality.

The quality of fringe focusing does not depend on:
1. The angle of orientation of the work surface, although a really large angle will cause all reflected light to be lost. The invention works quite well with angles approaching the acceptance angle of the lens entrance pupil.

2. Any patterns on the work surface. In fact, if there are distinct patterns on the surface, the autofocus algorithm will work equally as well. However, pattern focusing in the preferred embodiment produces less well defined focus curves than fringe focusing.

The embodiments as illustrated and discussed in this specification are intended only to teach those skilled in the art the best way known by the inventor to make and use the invention. Nothing in the specification should be considered as limiting the scope of the present invention. Many changes could be made by those skilled in the art to produce equivalent systems without departing from the invention. The present invention should be limited only by the following claims and their legal equivalence.

In the preferred embodiment, a programmed digital computer performs the data processing and physical control functions necessary to automatically apply the fringe focus method to the fringe focus apparatus.

The incident light beam should be planar, parallel and monochromatic. In the preferred embodiment, a laser is used as the light source. However, in theory a classical light source may be manipulated to provide a similar monochromatic light beam.

A laser with two power levels has been used. The lower power level is used to focus the beam on the work piece. Then the upper power level is used to etch the work piece. This allows the same laser and laser control system to do both focusing and etching. This avoids calibration problems found where two systems are used, one for focus and one for etching.

For ease of explanation, it is often discussed herein how the lens is moved in the method and apparatus, while the work piece is held fixed. However, it is equivalent to move the work piece and hold the lens fixed.

Furthermore, the preferred embodiment is adapted to focus the etching laser in an automated apparatus and method to make integrated circuit chips. However, the present invention has broad application to a variety of other focus applications. Further, finding the focus position of the lens in relation to the work piece, as discussed herein, is equivalent to finding the distance to the work piece from the apparatus, since the focal distance is a known constant for any given lens. That is, when the light is focused on the work piece, it is then known that the work piece is at a distance from the lens exactly equal to the known focal distance of that lens.

The preferred embodiment in FIG. 1 shows a certain layout of the means of directing the beam 11 through the lens, to the work piece, back through the lens, through the fringe plate, and to the vision detector. This embodiment uses a partial mirror to direct the light in this way to these elements. However, other equivalent ways to direct the light may be used. For example, the beam 11 might pass directly to the lens, passing through the transparent back of a mirror. Then the beam, coming back from the lens and work piece may reflect off the other side of the mirror, the reflective side, towards the fringe plate. Other equivalent configurations can also be used.

We claim:

1. A fringe focus apparatus comprising:
   a) a light beam, which is planar, parallel, and monochromatic,
   b) a deflector through which the light beam passes, which scans the beam through a range of angles,
   c) an objective lens with a focal point, placed such that the light beam passes through the lens and focuses to the focal point,
   d) a work surface in the line of the optic axis of the lens and in the vicinity of or at the focal point, the light beam striking the work surface, and reflecting off it,
   e) a fringe plate positioned in the path of the light beam after it reflects off the work surface, and passes back through the lens,
   f) a vision detector on which are formed interference patterns from the interference of the light beam split by passing through the fringe plate,
   g) a means for processing the signal from the vision detector while the light beam is scanned through an angle to determine if the signal is characteristic of a focused or unfocused condition of the light beam on the work piece, and
   h) a means for changing the position of the lens relative to the work piece.

2. The invention in claim 1, further comprising:
   a mirror of less than total reflectivity which reflects a portion of the light beam from the deflectors to the lens, and which allows a portion of the light beam to pass through the mirror from the lens to the fringe plate.

3. The invention in claim 1, further compromising:
   a mirror which allows the light beam to pass through it from the deflectors to the lens, and which reflects the light beam from the lens to the fringe plate.

4. The invention of claim 1, where the light beam is generated by a laser.

5. The invention of claim 4, where the laser has two power levels, one for focusing the beam with this invention and a higher power level for etching the work piece.

6. The invention in claim 1, where the deflector is an element chosen from the group comprising (i) a rotating mirror, (ii) a vibrating mirror, and (iii) an acousto-optic deflector.

7. The invention in claim 1, where the work surface is an integrated circuit chip.

8. The invention in claim 1, where the vision detector is a photocell.

9. The invention in claim 1, where the means for processing the signal from the vision detector is a programmed digital computer.

10. The invention in claim 1, where the means for changing the position of the lens relative to the work piece is a means for moving the lens along its optic axis.

11. The invention in claim 1, where the means for changing the position of the lens relative to the work piece is a means of moving the work piece.

12. A fringe focus process comprising:
   a) projecting a light beam which is planar, parallel and monochromatic,
   b) deflecting the light beams to scan through a range of angles,
   c) focusing the light beam towards a focal point by passing it through an objective lens,
   d) striking a work surface with the focusing light beam and reflecting the light off the work surface, which work surface may be either at the focal point of the lens or not at the focal point of the lens, e) splitting the light from the work piece and lens into at least two parallel beams, by passing it through a fringe plate, f) passing the split beams to a vision detector to form an interference pattern on the vision detector, g) changing the position of the lens relative to the work piece a plurality of times, to include a range of positions within which it is known lays the position to focus the light on the work piece, and repeating the preceding steps for each position, and h) processing the signal from the vision detector for each position of the lens relative to the work piece, to determine at which position of the lens the signal is characteristic of a focused condition for the light beam scanning on the work piece.

13. The method in claim 12, further comprising:

a) reflecting the light beam which has been deflected with a mirror, to the lens, and allowing the light beam from the lens to pass through the mirror to the fringe plate.

14. The method in claim 12, further comprising:

allowing the light beam which has been deflected to pass directly to the lens, through a mirror, and b) reflecting the light beam which has been deflected with the mirror from the lens to the fringe plate.

15. The invention in claim 12, where the projected light beam is laser light.

16. The invention in claim 15 further comprising:

when the lens position for the focus condition is determined, moving the lens to that focus position and changing the laser to a second higher power level to etch the work piece.

17. The invention in claim 12, where the position of the lens relative to the work piece is changed either by moving the lens or by moving the work piece.

18. The invention as in claim 12, wherein said changing step includes the steps of:

a) setting upper and lower limits of the position of the lens, within which a focus position of the lens relative to the workpiece is known to lie, b) moving the lens to the lower limit position and determining a measure of focus quality at that position by processing the vision detector signal while scanning the light beam at that lens position, and storing that measure in computer memory, c) moving the lens to a next incremental position and repeating the determination of the measure of focus quality at that position, and storing that measure in computer memory, d) repeating step (c) at each next lens position until the upper position limit is reached, e) reviewing all such measures of focus quality to determine the maximum measure of focus quality, and f) recalling the lens position for the maximum measure of focus quality, and designating that lens position as the focus position.

19. The invention in claim 18, where determining the measure of focus quality at a lens position, further comprises:

a) measuring the vision detector signal as the light beam is scanned through a range of angles, b) calculating sum of the squares of a first derivative of the vision detector signal with respect to a scan angle of the light beam over a scan range of the angles, and indicating that as the measure of focus quality for that lens position.

20. The invention in claim 18, where determining the maximum measure further comprises:

a) fitting a parabola to the area around the maximum point of the focal curve by least squares multiple regression analysis, and b) indicating the axis of such parabola as the position of focus of the lens.

* * * * *